(12) United States Patent
Musa et al.

(10) Patent No.: US 7,468,407 B2
(45) Date of Patent: Dec. 23, 2008

(54) METAL SALTS OF QUINOLINOLS AND QUINOLINOL DERIVATIVES IN CURABLE COMPOSITIONS

(75) Inventors: Osama M. Musa, Hillsborough, NJ (US); Harry Richard Kuder, Fullerton, CA (US)

(73) Assignee: National Starch and Chemical Investment Holding Copporation, New Castle, DE (US)

( * ) Notice: Subject to any disclaimer, the term of this patent is extended or adjusted under 35 U.S.C. 154(b) by 429 days.

(21) Appl. No.: 11/235,991

(22) Filed: Sep. 26, 2005

(65) Prior Publication Data

US 2007/0072966 A1    Mar. 29, 2007

(51) Int. Cl.
*C08K 5/00* (2006.01)
(52) U.S. Cl. .............................. 524/87; 524/99; 524/100
(58) Field of Classification Search .................... 524/87, 524/99, 100
See application file for complete search history.

(56) References Cited

U.S. PATENT DOCUMENTS

| 2,876,208 | A | * | 3/1959 | Naps ........................... 523/400 |
| 3,637,711 | A | | 1/1972 | Budde et al. |
| 4,066,652 | A | | 1/1978 | Hartlage |
| 5,066,328 | A | * | 11/1991 | Zlotnik .................... 106/18.32 |
| 5,744,533 | A | | 4/1998 | Iwamoto et al. |
| 2003/0111519 | A1 | | 6/2003 | Kinney et al. |
| 2007/0072968 | A1 | * | 3/2007 | Musa et al. ................. 524/100 |

FOREIGN PATENT DOCUMENTS

| JP | 55040755 A | * | 3/1980 |
| WO | WO 01/46290 | | 6/2001 |
| WO | WO 2004/073030 | | 8/2004 |

OTHER PUBLICATIONS

JP 55040755 A, Derwent Abstract, Mar. 1980.*
Ouali, Mohammed et al.: "Tautomers of styrylquinoline derivatives containing a methoxy substituent: Computation of their population in aqueous solution and their interaction with RSV integrase catalytic core"; Acta Biochimica Polonica; vol. 47 No. 1/2000; 11-22.
Du, Naiying et al.: "Synthesis and Photophysical Characterization of the Free-Radical Copolymerization of Metaloquinolate-Pendant Monomers with Methyl Methacrylate"; Journal of Pol. Science: Part A: Polymer Chemistry, vol. 43, 397-406 (2005).
Nanjundan, S. et al.: "Synthesis and characterization of poly(3-acetyl-4-hydroxyphenyl acrylate) and its Cu(II) and Ni(II) complexes";European Polymer Journal 40 (2004) 2313-2321.
Zhao, Ke-Qing et al.: "2-methyl-5-chloromethyl-8-hydroxyquinoline"; Molbank 2001, 6, M208.
Wang, Xian-Yong et al.: "Poly(styrene)-Supported $Alq_3$ and $BPh_2q$"; Macromolecules 2005, 38, 7219-7224; pp. 7219-7224.
Phillips, J. P.: "The Reactions Of 8-Quinolinol"; Chem. Dept. University of Louisville, Louisville, Kentucky, Nov. 29, 1955; pp. 271-297.

* cited by examiner

*Primary Examiner*—Bernard Lipman
(74) *Attorney, Agent, or Firm*—Jane E. Gennaro

(57) ABSTRACT

Curable compositions exhibit improved adhesion and conductivity by the addition of a metal salt of 8-quinolinol or of an 8-quinolinol derivative as an adhesion and/or conductivity promoter. The metal salt of 8-quinolinol or of an 8-quinolinol derivative is formed by coordination with a metal selected from the group consisting of Cu, Be, Mg, Ca, Sr, Ba, Zn, Cd, Al, Ga, In, Tl, Yt, La, Pb, Sb, Bi, Cr, Mo, Mn, Fe, Co, Ni, Pd, Ce, and Pr. Examples of quinolinol derivative salts have the structures:

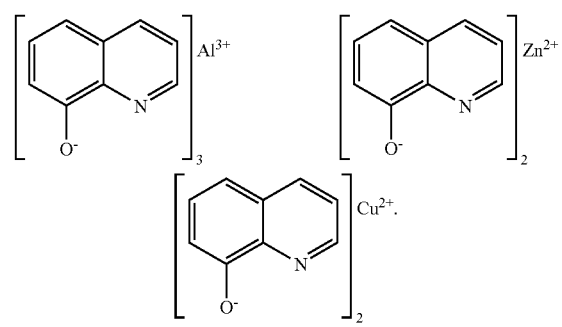

4 Claims, No Drawings

METAL SALTS OF QUINOLINOLS AND QUINOLINOL DERIVATIVES IN CURABLE COMPOSITIONS

FIELD OF THE INVENTION

This invention relates to die attach adhesives containing metal salts of quinolinols and quinolinol derivatives as adhesion promoters and conductivity promoters.

BACKGROUND OF THE INVENTION

In the fabrication and assembly of semiconductor packages, an integrated circuit chip or die is attached to a lead frame with adhesive and wire bonding, and the die and inner lead frame assembly encapsulated in a molding resin. After encapsulation, the outer leads of the lead frame are attached to a printed circuit board or other external device. Any exposed metal surfaces, particularly copper, on lead frames or printed wire boards are subject to oxidation with exposure to air and are routinely coated with antioxidants. However, the presence of antioxidants is suspected of interfering with the bonding process during the die attach, wire bonding, encapsulation, and final soldering operations in the manufacture of the semiconductor package and its attachment to a printed circuit board.

SUMMARY OF THE INVENTION

This invention is a die attach adhesive composition comprising a curable resin, optionally a curing agent for the resin, a filler, and a metal salt of 8-quinolinol or of an 8-quinolinol derivative. The metal salts of the 8-quinolinols or 8-quinolinol derivatives (hereinafter metal salts of 8-quinolinol(s) or 8-quinolinol metal salts) in these compositions act as adhesion promoters and conductivity promoters. As used herein, the phrases "adhesion promoter(s) and conductivity promoter(s)" and "adhesion promoter(s) or conductivity promoter(s)" will each mean "adhesion promoter(s) and/or conductivity promoter(s)." As used herein the term "8-quinolinol" and "8-hydroxy quinoline" are synonymous. Representative quinolinol salts are shown here:

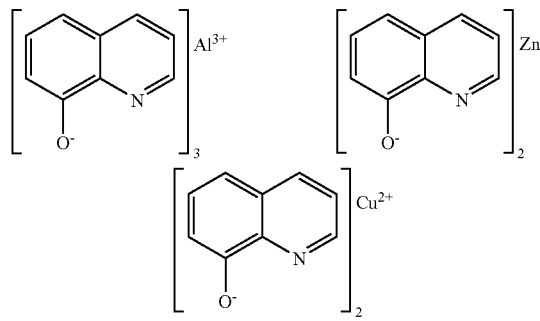

DETAILED DESCRIPTION OF THE INVENTION

The adhesion and conductivity promoters of this invention are the metal salts of 8-quinolinol compounds or compounds derived from 8-quinolinol (hereinafter quinolinol derivatives), by which is meant, compounds that contain the 8-quinolinol moiety. Suitable quinolinol compounds for coordination with metals to form the metal salts, are, for example:

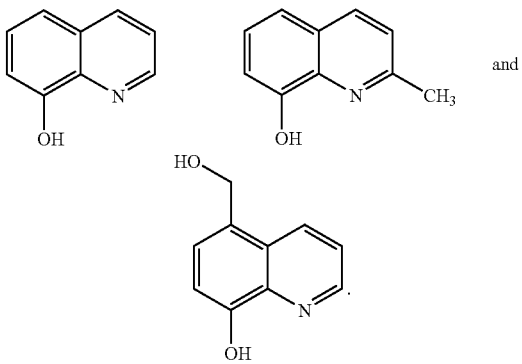

Exemplary 8-quinolinol derivatives for coordination with metals to form the metal salts are those having the following bis-quinolinol structure:

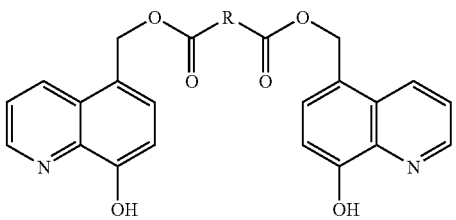

The bis-quinolinol can be prepared by the reaction of hydroxyl-functionalized quinolinol with a selected di-acid via Fisher esterification. The nature of the bridge between the quinolinol functionalities is determined by the structure of the acid. Properties such as melting point and solubility can be controlled through selection of the proper di-acid.

The reaction can be exemplified by the reaction scheme here, in which R is any organic moiety:

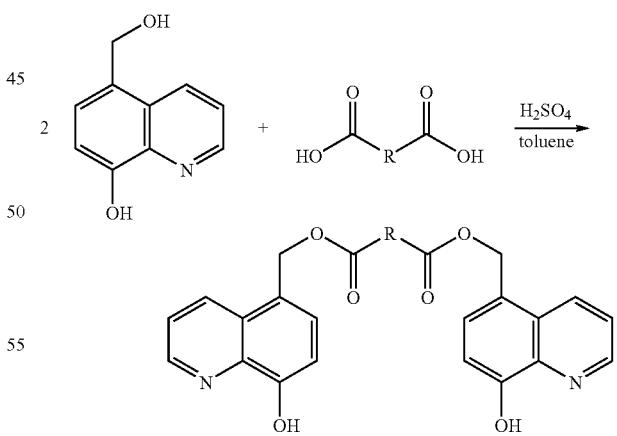

Specific suitable compounds include those in which R is an alkyl group, and in particular, a pentyl, hexyl, heptyl or octyl group. Other compounds include those in which R is an aromatic group.

Other quinolinol derivatives for coordinating with metals to form the metal salts are exemplified by the following compounds, which contain polymerizable functionality and can be reacted into the die attach composition during cure; consequently, they are not subject to volatilization and their use reduces voiding at increased temperatures. Examples include the following:

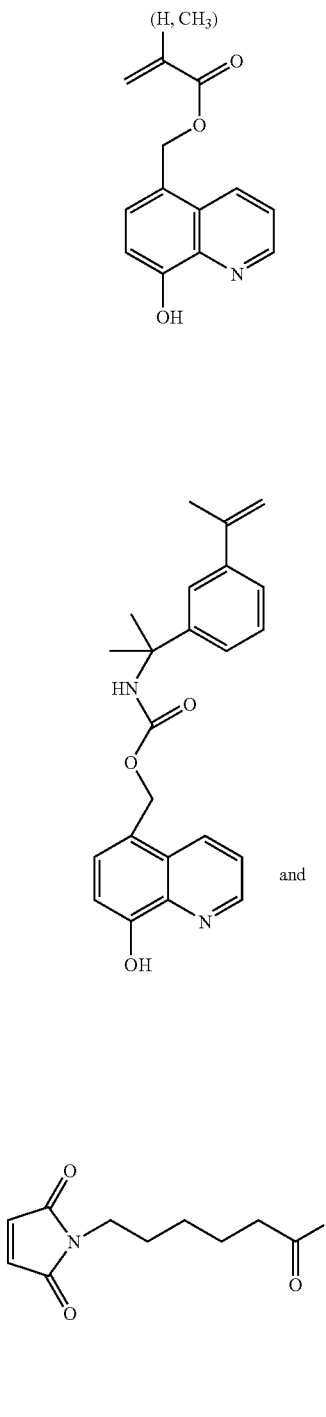

The reactive functionalities in the above Compounds A, B, and C, respectively are acrylate, styrenic, and maleimide functionalities. Other suitable reactive functionalities include epoxies, oxetanes, benzotriazoles, cinnamyl compounds, styrenic compounds, and vinyl ethers.

The syntheses of these and similar compounds is within the expertise of one skilled in the art of organic synthesis; the synthetic scheme for Compounds A, B, and C are shown here:

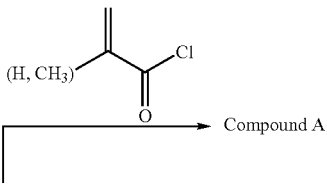

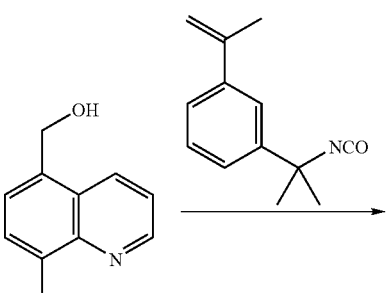

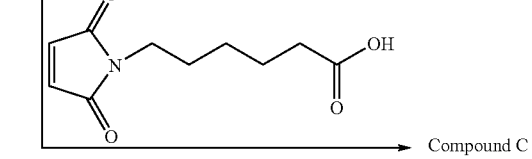

It will be understood by those skilled in the art that other functionalities can be built into these compounds by similar reactions.

The metal salts of quinolinols can be obtained commercially from Aldrich. Alternatively, the salts can be prepared by known syntheses, such as those disclosed in the references cited in the review article "The Reactions of 8-Quinolinol" by J.P. Phillips in CHEMICAL REVIEWS, VOLUME 56, 1956, published for The American Chemical Society by the Williams & Wilkins Company, Baltimore, USA. In brief, the metal salts of 8-quinolinol or of 8-quinolinol derivatives are formed by coordination of the quinolinols with metals selected from the group consisting of Cu, Be, Mg, Ca, Sr, Ba, Zn, Cd, Al, Ga, In, Tl, Yt, La, Pb, Sb, Bi, Cr, Mo, Mn, Fe, Co, Ni, Pd, Ce, and Pr. Several other rare earth metals may also be used.

Within the die attach composition, the curable resin will be present in an amount from 10 to 99.5 weight %; the curing agent will be present in an effective amount, typically up to 30 weight %; the fillers, if present, will be present in an amount up to 90 weight %; and the metal salt adhesion and conductivity promoter will be present in an effective amount, which can be up to 30 weight %. In typical embodiments, the adhesion and conductivity promoter is present at a low level, more usually from 0.1 to 10 weight %.

Suitable curable resins for the composition include thermoset and thermoplastic polymers, and in particular are selected from the group consisting of epoxy, maleimide (including bismaleimide), acrylates and methacrylates, and cyanate esters. Other useful resins include vinyl ethers, vinyl silanes, thiol-enes, and resins that contain carbon to carbon double bonds attached to an aromatic ring and conjugated with the unsaturation in the aromatic ring (such as compounds derived from cinnamyl and styrenic starting compounds), and fumarates and maleates.

Other exemplary polymers include polyamides, phenoxy compounds, benzoxazines, polybenzoxazines, polyether sulfones, polyimides, siliconized olefins, polyolefins, polyesters, polystyrenes, polycarbonates, polypropylenes, poly(vinyl chloride)s, polyisobutylenes, polyacrylonitriles, poly(vinyl acetate)s, poly(2-vinylpyridine)s, cis-1,4-polyisoprenes, 3,4-polychloroprenes, vinyl copolymers, poly(ethylene oxide)s, poly(ethylene glycol)s, polyformaldehydes, polyacetaldehydes, poly(b-propiolac-etone)s, poly(10-decanoate)s, poly(ethylene terephthalate)s, polycaprolactams, poly(11-undecanoamide)s, poly(m-phenylene-terephthalamide)s, poly(tetramethlyene-m-benzene-sulfonamide)s, polyester polyarylates, poly(phenylene oxide)s, poly(phenylene sulfide)s, poly(sulfone)s, polyetherketones, polyetherimides, fluorinated polyimides, polyimide siloxanes, poly-isoindolo-quinazolinediones, polythioether-imide poly-phenyl-quinoxalines, polyquinixalones, imide-aryl ether phenylquinoxaline copolymers, polyquinoxalines, polybenzimidazoles, polybenzoxazoles, polynorbornenes, poly(arylene ethers), polysilanes, parylenes, benzocyclobutenes, hydroxyl-(benzoxazole) copolymers, and poly(silarylene siloxanes).

Suitable cyanate ester resins include those having the generic structure

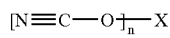

in which n is 1 or larger, and X is a hydrocarbon group. Exemplary X entities include, but are not limited to, bisphenol A, bisphenol F, bisphenol S, bisphenol E, bisphenol O, phenol or cresol novolac, dicyclopentadiene, polybutadiene, polycarbonate, polyurethane, polyether, or polyester. Commercially available cyanate ester materials include; AroCy L-10, AroCy XU366, AroCy XU371, AroCy XU378, XU71787.02L, and XU 71787.07L, available from Huntsman LLC; Primaset PT30, Primaset PT30 S75, Primaset PT60, Primaset PT60S, Primaset BADCY, Primaset DA230S, Primaset MethylCy, and Primaset LECY, available from Lonza Group Limited; 2-allyphenol cyanate ester, 4-methoxyphenol cyanate ester, 2,2-bis(4-cyanatophenol)-1,1,1,3,3,3-hexafluoropropane, bisphenol A cyanate ester, diallylbisphenol A cyanate ester, 4-phenylphenol cyanate ester, 1,1,1-tris(4-cyanatophenyl)ethane, 4-cumylphenol cyanate ester, 1,1-bis(4-cyanato-phenyl)ethane, 2,2,3,4,4,5,5,6,6,7,7-dodecafluoro-octanediol dicyanate ester, and 4,4'-bisphenol cyanate ester, available from Oakwood Products, Inc.

Other suitable cyanate esters include cyanate esters having the structure:

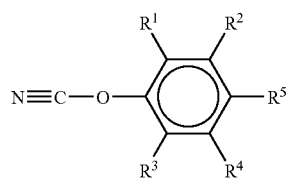

in which $R^1$ to $R^4$ independently are hydrogen, $C_1$-$C_{10}$ alkyl, $C_3$-$C_8$ cycloalkyl, $C_1$-$C_{10}$ alkoxy, halogen, phenyl, phenoxy, and partially or fully fluorinated alkyl or aryl groups (an example is phenylene-1,3-dicyanate);

cyanate esters having the structure:

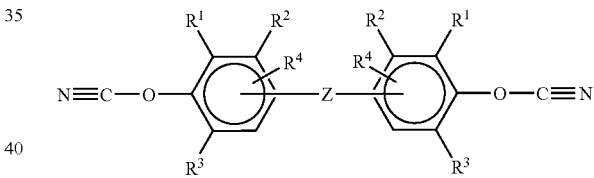

in which $R^1$ to $R^5$ independently are hydrogen, $C_1$-$C_{10}$ alkyl, $C_3$-$C_8$ cycloalkyl, $C_1$-$C_{10}$ alkoxy, halogen, phenyl, phenoxy, and partially or fully fluorinated alkyl or aryl groups;

cyanate esters having the structure:

in which $R^1$ to $R^4$ independently are hydrogen, $C_1$-$C_{10}$ alkyl, $C_3$-$C_8$ cycloalkyl, $C_1$-$C_{10}$ alkoxy, halogen, phenyl, phenoxy, and partially or fully fluorinated alkyl or aryl groups; Z is a chemical bond or $SO_2$, $CF_2$, $CH_2$, CHF, $CHCH_3$, isopropyl, hexafluoroisopropyl, $C_1$-$C_{10}$ alkyl, O, N=N, $R^8C$=$CR^8$ (in which $R^8$ is H, C, to $C_{10}$ alkyl, or an aryl group), $R^8COO$, $R^8C$=N, $R^8C$=N—$C(R^8)$=N, $C_1$-$C_{10}$ alkoxy, S, $Si(CH_3)_2$ or one of the following structures:

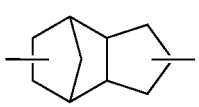 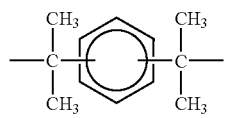

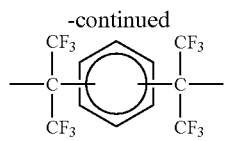

(an example is 4,4' ethylidenebisphenylene cyanate having the commercial name AroCy L-10 from Vantico);

cyanate esters having the structure:

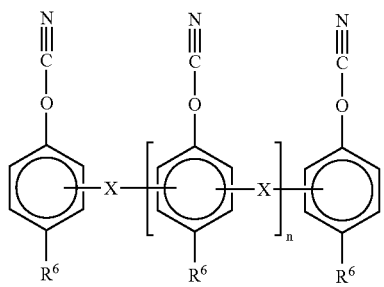

in which $R^6$ is hydrogen or $C_1$-$C_{10}$ alkyl and X is $CH_2$ or one of the following structures

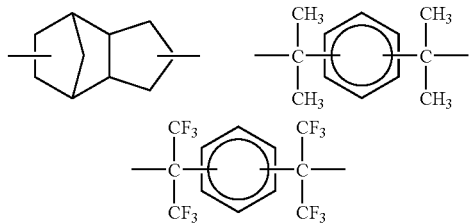

and n is a number from 0 to 20 (examples include XU366 and XU71787.07, commercial products from Vantico);

cyanate esters having the structure: $N{\equiv}C{-}O{-}R^7{-}O{-}C{\equiv}N$, and cyanate esters having the structure: $N{\equiv}C{-}O{-}R^7$, in which $R^7$ is a non-aromatic hydrocarbon chain with 3 to 12 carbon atoms, which hydrocarbon chain may be optionally partially or fully fluorinated.

Suitable epoxy resins include bisphenol, naphthalene, and aliphatic type epoxies. Commercially available materials include bisphenol type epoxy resins (Epiclon 830LVP, 830CRP, 835LV, 850CRP) available from Dainippon Ink & Chemicals, Inc.; naphthalene type epoxy (Epiclon HP4032) available from Dainippon Ink & Chemicals, Inc.; aliphatic epoxy resins (Araldite CY179, 184, 192, 175, 179) available from Ciba Specialty Chemicals, (Epoxy 1234, 249, 206) available from Dow Corporation, and (EHPE-3150) available from Daicel Chemical Industries, Ltd.

Other suitable epoxy resins include cycloaliphatic epoxy resins, bisphenol-A type epoxy resins, bisphenol-F type epoxy resins, epoxy novolac resins, biphenyl type epoxy resins, naphthalene type epoxy resins, dicyclopentadienephenol type epoxy resins, Suitable maleimide resins include those having the generic structure

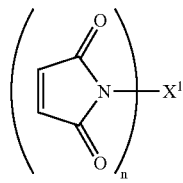

in which n is 1 to 3 and $X^1$ is an aliphatic or aromatic group. Exemplary $X^1$ entities include, poly(butadienes), poly(carbonates), poly(urethanes), poly(ethers), poly(esters), simple hydrocarbons, and simple hydrocarbons containing functionalities such as carbonyl, carboxyl, amide, carbamate, urea, ester, or ether. These types of resins are commercially available and can be obtained, for example, from Dainippon Ink and Chemical, Inc.

Additional suitable maleimide resins include, but are not limited to, solid aromatic bismaleimide (BMI) resins, particularly those having the structure

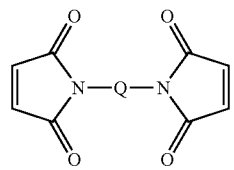

in which Q is an aromatic group. Exemplary aromatic groups include:

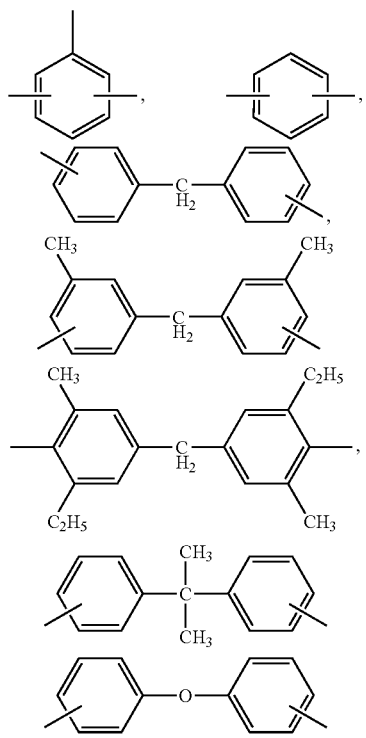

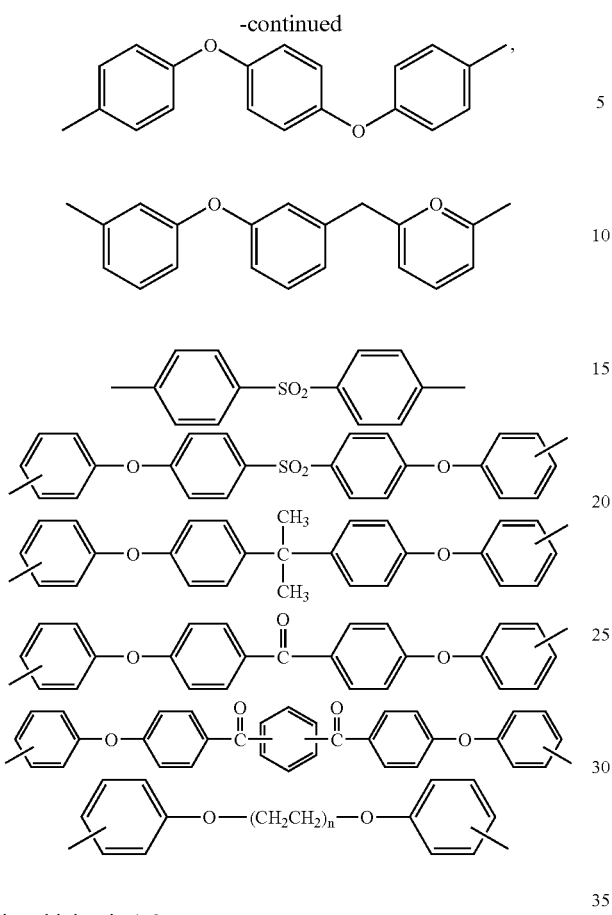
in which n is 1-3,
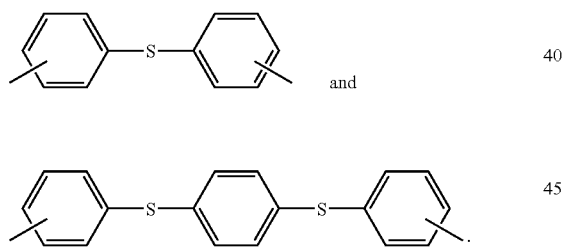
Bismaleimide resins having these Q bridging groups are commercially available, and can be obtained, for example, from Sartomer (USA) or HOS-Technic GmbH (Austria).
Other suitable maleimide resins include the following:
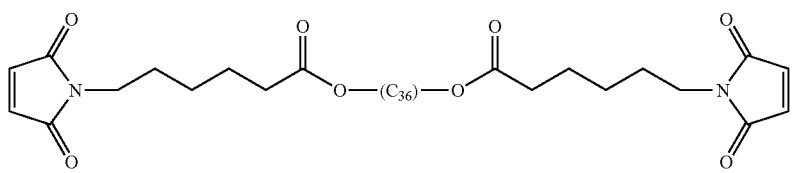
in which $C_{36}$ represents a linear or branched chain hydrocarbon chain (with or without cyclic moieties) of 36 carbon atoms;

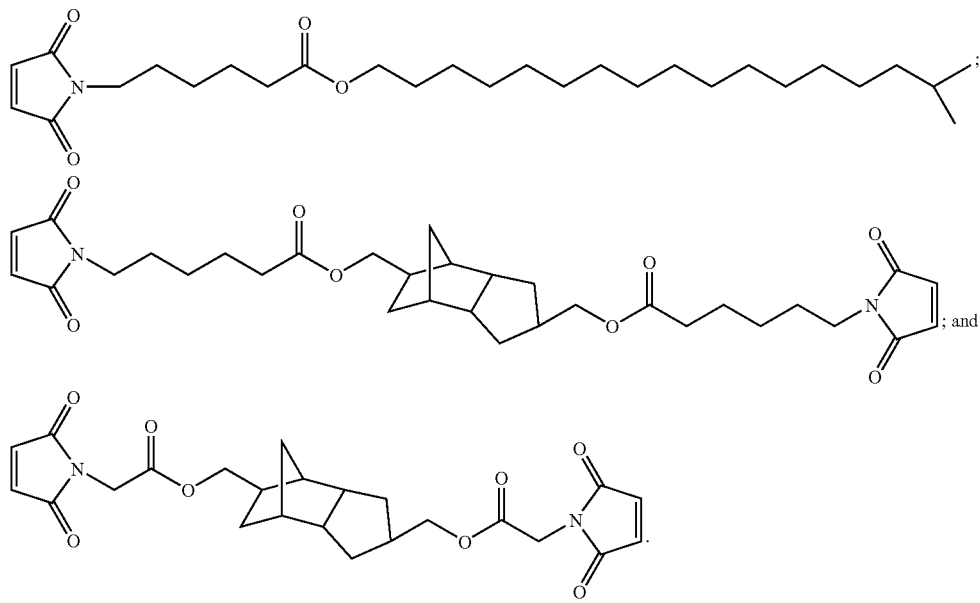

Suitable acrylate and methacrylate resins include those having the generic structure

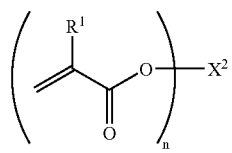

in which n is 1 to 6, $R^1$ is —H or —$CH_3$, and $X^2$ is an aromatic or aliphatic group. Exemplary $X^2$ entities include poly(butadienes), poly-(carbonates), poly(urethanes), poly(ethers), poly(esters), simple hydrocarbons, and simple hydrocarbons containing functionalities such as carbonyl, carboxyl, amide, carbamate, urea, ester, or ether. Commercially available materials include butyl (meth)acrylate, isobutyl(meth)acrylate, 2-ethyl hexyl(meth)acrylate, isodecyl (meth)acrylate, n-lauryl(meth)acrylate, alkyl(meth)-acrylate, tridecyl(meth)acrylate, n-stearyl (meth)acrylate, cyclohexyl(meth)-acrylate, tetrahydrofurfuryl(meth)acrylate, 2-phenoxy ethyl (meth)acrylate, isobornyl(meth)acrylate, 1,4-butanediol di(meth)acrylate, 1,6-hexanediol di(meth)acrylate, 1,9-nonandiol di(meth)acrylate, perfluorooctylethyl (meth)acrylate, 1,10 decandiol di(meth)acrylate, nonylphenol polypropoxylate (meth)acrylate, and polypentoxylate tetrahydrofurfuryl acrylate, available from Kyoeisha Chemical Co., LTD; polybutadiene urethane dimethacrylate (CN302, NTX6513) and polybutadiene dimethacrylate (CN301, NTX6039, PRO6270) available from Sartomer Company, Inc; polycarbonate urethane diacrylate (ArtResin UN9200A) available from Negami Chemical Industries Co., LTD; acrylated aliphatic urethane oligomers (Ebecryl 230, 264, 265, 270, 284, 4830, 4833, 4834, 4835, 4866, 4881, 4883, 8402, 8800-20R, 8803, 8804) available from Radcure Specialities, Inc; polyester acrylate oligomers (Ebecryl 657, 770, 810, 830, 1657, 1810, 1830) available from Radcure Specialities, Inc.; and epoxy acrylate resins (CN104, 111, 112, 115, 116, 117, 118, 119, 120, 124, 136) available from Sartomer Company, Inc. In one embodiment the acrylate resins are selected from the group consisting of isobornyl acrylate, isobornyl methacrylate, lauryl acrylate, lauryl methacrylate, poly(butadiene) with acrylate functionality and poly (butadiene) with methacrylate functionality.

Suitable vinyl ether resins are any containing vinyl ether functionality and include poly(butadienes), poly(carbonates), poly(urethanes), poly(ethers), poly(esters), simple hydrocarbons, and simple hydrocarbons containing functionalities such as carbonyl, carboxyl, amide, carbamate, urea, ester, or ether. Commercially available resins include cyclohenanedimethanol divinylether, dodecylvinylether, cyclohexyl vinylether, 2-ethylhexyl vinylether, dipropyleneglycol divinylether, hexanediol divinylether, octadecylvinylether, and butandiol divinylether available from International Speciality Products (ISP); Vectomer4010, 4020, 4030, 4040, 4051, 4210, 4220, 4230, 4060, 5015 available from Sigma-Aldrich, Inc.

The curing agent can be either a free radical initiator or ionic initiator (either cationic or anionic), depending on whether a radical or ionic curing resin is chosen, and will be present in an effective amount. For free radical curing agents, an effective amount typically is 0.1 to 10 percent by weight of the organic compounds (excluding any filler), but can be as high as 30 percent by weight. For ionic curing agents or initiators, an effective amount typically is 0.1 to 10 percent by weight of the organic compounds (excluding any filler), but can be as high as 30 percent by weight. Examples of curing agents include imidazoles, tertiary amines, organic metal salts, amine salts and modified imidazole compounds, inorganic metal salts, phenols, acid anhydrides, and other such compounds.

Exemplary imidazoles include but are not limited to: 2-methyl-imidazole, 2-undecyl-imidazole, 2-heptadecyl imidazole, 2-phenylimidazole, 2-ethyl 4-methyl-imidazole, 1-benzyl-2-methylimidazole, 1-propyl-2-methyl-imidazole, 1-cyano-ethyl-2-methylimidazole, 1-cyanoethyl-2-ethyl-4-methyl-imidazole, 1-cyanoethyl-2-undecylimidazole, 1-cyanoethyl-2-phenylimidazole, 1-guanaminoethyl-2-methylimidazole, and addition products of an imidazole and trimellitic acid.

Exemplary tertiary amines include but are not limited to: N,N-dimethyl benzylamine, N,N-dimethylaniline, N,N-dimethyl-toluidine, N,N-dimethyl-p-anisidine, p-halogeno-N,N-dimethylaniline, 2-N-ethylanilino ethanol, tri-n-butylamine, pyridine, quinoline, N-methylmorpholine, triethanolamine, triethylenediamine, N,N,N',N'-tetramethylbutanediamine, N-methylpiperidine. Other suitable nitrogen containing compounds include dicyandiamide, diallylmelamine, diaminomalconitrile, amine salts, and modified imidazole compounds.

Exemplary phenols include but are not limited to: phenol, cresol, xylenol, resorcine, phenol novolac, and phloroglucin.

Exemplary organic metal salts include but are not limited to: lead naphthenate, lead stearate, zinc naphthenate, zinc octolate, tin oleate, dibutyl tin maleate, manganese naphthenate, cobalt naphthenate, and acetyl aceton iron. Other suitable metal compounds include but are not limited to: metal acetoacetonates, metal octoates, metal acetates, metal halides, metal imidazole complexes, Co(II)(acetoacetonate), Cu(II)(acetoacetonate), Mn(II)(acetoacetonate), Ti(acetoacetonate), and Fe(II)(acetoacetonate). Exemplary inorganic metal salts include but are not limited to: stannic chloride, zinc chloride and aluminum chloride.

Exemplary peroxides include but are not limited to: benzoyl peroxide, lauroyl peroxide, octanoyl peroxide, butyl peroctoate, dicumyl peroxide, acetyl peroxide, para-chlorobenzoyl peroxide and di-t-butyl diperphthalate;

Exemplary acid anhydrides include but are not limited to: maleic anhydride, phthalic anhydride, lauric anhydride, pyromellitic anhydride, trimellitic anhydride, hexahydrophthalic anhydride; hexahydropyromellitic anhydride and hexahydrotrimellitic anhydride.

Exemplary azo compounds include but are not limited to: azoisobutylonitrile, 2,2'-azobispropane, 2,2'-azobis(2-methylbutanenitrile), m,m'-azoxystyrene. Other suitable compounds include hydrozones; adipic dihydrazide and BF3-amine complexes.

In some cases, it may be desirable to use more than one type of cure, for example, both cationic and free radical initiation, in which case both free radical cure and ionic cure resins can be used in the composition. Such a composition would permit, for example, the curing process to be started by cationic initiation using UV irradiation, and in a later processing step, to be completed by free radical initiation upon the application of heat In some systems in addition to curing agents, curing accelerators may be used to optimize the cure rate. Cure accelerators include, but are not limited to, metal napthenates, metal acetylacetonates (chelates), metal octoates, metal acetates, metal halides, metal imidazole complexes, metal amine complexes, triphenylphosphine, alkyl-substituted imidazoles, imidazolium salts, and onium borates.

Depending on the end application, one or more fillers may be included in the composition and usually are added for improved rheological properties and stress reduction. Examples of suitable nonconductive fillers include alumina, aluminum hydroxide, silica, fused silica, fumed silica, vermiculite, mica, wollastonite, calcium carbonate, titania, sand, glass, barium sulfate, zirconium, carbon black, organic fillers, and halogenated ethylene polymers, such as, tetrafluoroethylene, trifluoroethylene, vinylidene fluoride, vinyl fluoride, vinylidene chloride, and vinyl chloride. Examples of suitable conductive fillers include carbon black, graphite, gold, silver, copper, platinum, palladium, nickel, aluminum, silicon carbide, boron nitride, diamond, and alumina.

The filler particles may be of any appropriate size ranging from nano size to several mm. The choice of such size for any particular end use is within the expertise of one skilled in the art. Filler may be present in an amount from 10 to 90% by weight of the total composition. More than one filler type may be used in a composition and the fillers may or may not be surface treated. Appropriate filler sizes can be determined by the practitioner, but, in general, will be within the range of 20 nanometers to 100 microns.

EXAMPLES

Example 1

Preparation of Bis-Quinolinol

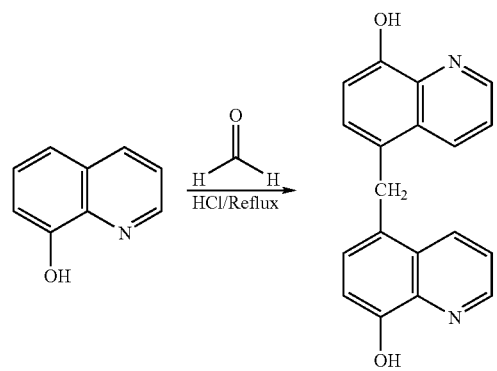

According to the procedure described by Donald. S. Noyce and Lloyd J. Dolby, *Amino- and Chloromethylation of 8-Quinolinol. Mechanism of Preponderant ortho Substitution in Phenols under Mannich Conditions*, in The Journal of Organic Chemistry, Volume 26, number 10, Oct. 24, 1961, at pages 4078 to 4083, bis-quinolinol was prepared via the reaction of 8-quinolinol and an excess of formaldehyde in an aqueous hydrochloric acid solution. 8-Quinolinol (29.0 grams, 0.2000 mol) and hydrochloric acid (37%, 85 mL) were combined in a four-neck, 250 mL, round bottom flask equipped with a magnetic stir bar, reflux condenser and hot oil bath. Initially, an exotherm of ~25° C. was observed upon mixing these reagents. Formaldehyde (37%, 9 mL), was then added which resulted in a change from a clear yellow solution to a gold solution. The mixture was heated at reflux for 90 minutes. During this time heavy acidic fumes were generated. After mixing for 15 minutes at reflux, crystalline yellow solids precipitated from solution. After refluxing, the mixture was cooled to room temperature and allowed to settle over night.

After 14 hours, it was observed that more solids had crystallized and that the flask was now choked with precipitate. The yellow solids were filtered from the clear gold mother liquor and dissolved in ~850 mL of water. The pH of the resulting yellow solution measured between 0 and 1. Concentrated ammonium hydroxide was slowly added to neutralize the solution. At a pH between 3 and 4, the clear yellow solution turned opaque and at a pH of 5, fine particles started forming. More ammonium hydroxide was added to a pH of 10.02. The add was complete within 90 minutes and during this time the temperature of the reaction solution/mixture never exceeded 27° C.

The reaction was mixed for 70 minutes resulting in a creamy white mixture of fine particle size. The final pH of the reaction was 10.08. A light grey powder cake was filtered from the mixture leaving a clear gold liquor. The cake was added to 300 mL of dimethylformamide and mixed vigorously for 30 minutes. Upon filtering, a white cake was collected; the filtrate was a light purple liquor. Next, the cake was added damp to 300 mL of acetone, mixed for 30 minutes and filtered. This wash was then repeated, leaving a white cake and a clear colorless filtrate. The white cake was air dried, pulverized to a white powder and dried further under vacuum at 50° C. over night. A 36% yield was obtained from this reaction.

The structure of this material was confirmed by $^1$HNMR, with the same peaks presented as disclosed in the literature, at a purity of about 95%, DSC results for bis-quinolinol indicated that the mp is 285° C., which value matches the melting point found in the literature. TGA results indicated a weight loss of only 1.2% at 200° C.

Example 2

Preparation of Quinolinol/Piperidine

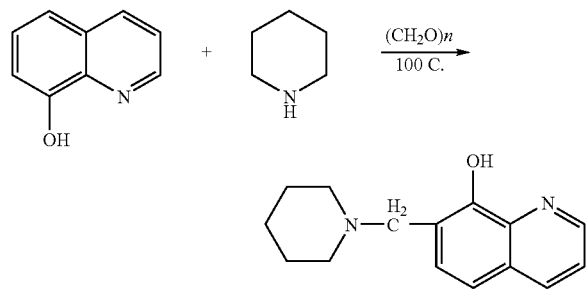

Quinolinol can be volatile, and in this example, a quinolinol/piperidine derivative was prepared in order to increase the bulk and reduce the volatility of quinolinol. The asymmetry of this derivative promoted a lower melting point than that found for the bis-quinolinol. Quinolinol/piperidine was prepared in a melt by the reaction of equimolar amounts of 8-quinolinol, piperidine and paraformaldehyde.

8-Quinolinol (29.0 grams, 0.2000 mol), piperidine (17.0 grams, 0.2000 mol) and paraformaldehyde (6.0 grams, 0.2000 mol) were charged to a 100 mL 3-neck round bottom flask equipped with a mechanical mixer, thermometer and reflux condenser. With mixing, the solids partially dissolved to an opaque gold liquid and the reaction temperature rose from room temperature to 71° C. within five minutes. Mixing was continued until the reaction temperature dropped to ~60° C. At this point, the flask was placed in a hot oil bath preheated to 100° C. The reaction was mixed in the bath over ~3.5 hours, during which time the reaction temperature ranged between 80 and 90° C.

At the end of the reaction, the product was a dark amber syrup. Residual starting materials were removed from the syrup via a Kugelrohr apparatus at 85° C. The resulting clear gold viscous liquid (33 grams) was combined with 33 mL of petroleum ether and triturated. A pale ivory powder thus formed from the syrup. The powder was washed twice more in petroleum ether and dried in the vacuum oven over two days at 70° C. The structure of this material was confirmed by both $^1$HNMR and GC/MS, with the results conforming to those found in the literature. A 41% yield was obtained from this reaction. The DSC melting point of 116° C. matched the melting point found in the literature (Donald. S. Noyce and Lloyd J. Dolby, *Amino- and Chloromethylation of 8-Quinolinol. Mechanism of Preponderant ortho Substitution in Phenols under Mannich Conditions*, in The Journal of Organic Chemistry, Volume 26, number 10, Oct. 24, 1961, at pages 4078 to 4083).

Example 3

Preparation of Hydroxy-Functionalized Quinolinol

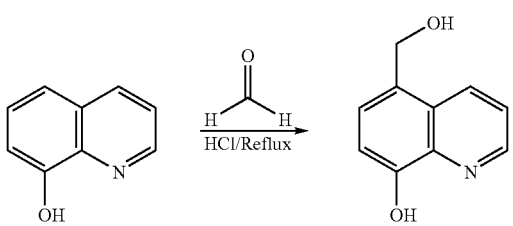

An hydroxy functionalized quinolinol intermediate was prepared via the reaction of equimolar amounts of 8-quinolinol and formaldehyde in an aqueous hydrochloric acid solution. (Note that quinolinol was synthesized similarly but with a molar excess of formaldehyde relative to 8-quinolinol). The product of this reaction showed improved solubility over bis-quinolinol and was more easily characterized. The synthesis procedure was obtained from Donald. S. Noyce and Lloyd J. Dolby, *Amino- and Chloromethylation of 8-Quinolinol. Mechanism of Preponderant ortho Substitution in Phenols under Mannich Conditions*, in The Journal of Organic Chemistry, Volume 26, number 10, Oct. 24, 1961, at pages 4078 to 4083.

8-Quinolinol (120.0 grams, 0.8267 mol), hydrochloric acid (37%, 352 mL) and formaldehyde (37%, 67.7 grams), were combined in a four-neck one liter round bottom flask equipped with a magnetic stir bar, thermometer, reflux condenser and hot oil bath. Upon mixing these reagents, an exotherm of ~20° C. was observed. The reaction became a clear gold solution. Next, the reaction was heated in a 125° C. oil bath and almost immediately yellow solids precipitated from solution. Heating was continued at reflux (95 to 111° C.) for ~65 minutes. The bright yellow reaction mixture then was cooled to room temperature.

The solids were filtered from the clear yellow mother liquor and dissolved in ~800 mL of water. The pH of the resulting deep yellow solution measured between 0 and 1. Concentrated ammonium hydroxide was slowly added to neutralize the solution. At a pH between 3 and 4, the clear yellow solution turned opaque red-orange. At pH 5, fine particles started forming and the reaction thickened. More ammonium hydroxide was added to a pH of 10.0. The add was complete within 50 minutes and during this time the temperature of the reaction solution/mixture never exceeded 35° C. The reaction was mixed for 60 minutes resulting in a yellow slurry of fine particle size. It was then mixed over night and the final pH of the reaction was 10.15.

A tan powder cake was filtered from the mixture leaving a dark amber liquor. The cake was added to 500 mL of dimethylformamide and mixed vigorously for 30 minutes. Upon filtering, a white cake was collected; the filtrate was a light clear gold liquor. This water wash was repeated. The white cake was air dried, pulverized to a powder and dried further under vacuum at 45° C. over night. A 42% yield was obtained from this reaction. The structure of this material was confirmed by both $^1$HNMR and GC/MS. In addition, a DSC scan was performed to yield a melting point of 137° C., which was very close to the melting point of 138-139° C. found in the above referenced literature.

Example 4

Worklife

The worklife of a curable composition containing 8-hydroxyquinoline Cu (II) salt was measured as a function of increase in viscosity 16 hours after a freeze/thaw cycle. The curable composition was formulated to contain 7.5 parts by weight bismaleimide resin, 102 parts by weight acrylate resins, 4.0 parts by weight epoxy resin, 1 part by weight fumed silica, with minor amounts of curing agents and adhesion promoters. This resin formulation was mixed at 20 weight percent with 80 weight percent silver flakes and used as the control composition. Two additional samples were prepared, one containing 19.5 weight percent of the resin formulation, 0.5 weight percent of the salts and 80 weight percent silver flakes, and the second containing 19 weight percent of the resin formulation, 1.0 weight percent of the salts and 80 weight percent silver flakes. A control formulation contained no 8-hydroxyquinoline Cu (II) salt and showed an increase in viscosity of 21%. The formulation containing 0.5 weight % 8-hydroxylquinoline Cu (II) salt showed an increase of 18%; the formulation containing 1.0 weight % of the salt showed an increase of 15%. Thus, the addition of the 8-hydroxyquninoline Cu (II) salt did not affect the worklife of a typical die attach formulation.

Example 5

Bond Joint Resistance

The same formulation as was prepared in example 4 was mixed at 20 weight percent with 80 weight percent silver flakes and used as the control composition. Two additional samples were prepared, one containing 19.5 weight percent of the resin formulation, 0.5 weight percent of the salts and 80 weight percent silver flakes, and the second containing 19 weight percent of the resin formulation, 1.0 weight percent of the salts and 80 weight percent silver flakes. Bond joint resistance test comprised of a copper squares test coupon at 6.0× 6.0×1.0 mm adhered by curable die attach adhesive to copper lead-frames with a bond pad of 10.0×10.0×0.12 mm. and cured at 30 minutes ramp from 25° C. to 175° C., hold 15 minutes at 175° C. The electrical resistance in micro-ohm is measured across the bond joint with a Keithley Nonovoltmeter 2182/2440. Each sample was tested for bond joint resistance and each test was conducted four times per sample. The results were pooled and averaged and the bond joint resistance (BJR) across the adhesive joint is reported in Kg force in Table A.

The data are reported in the Table A (in which 8-HQ stands for 8-hydroxy-quninoline) and show that the addition of the aluminum (Al), copper (Cu) and zinc (Zn) metal salts improves the conductivity of the formulation.

TABLE A

| CONDUCTIVITY | |
|---|---|
| METAL SALT | BOND JOINT RESISTANCE |
| Control, no metal salt | 0.0017 ohm |
| Al-8-HQ at 0.5 wt % | 0.0010 ohm |
| Al-8-HQ at 1.0 wt % | 0.00025 ohm |
| Cu-8-HQ at 0.5 wt % | 0.00018 ohm |
| Cu-8-HQ at 1.0 wt % | 0.00015 ohm |
| Zn-8-HQ at 0.5 wt % | 0.00057 ohm |
| Zn-8-HQ at 1.0 wt % | 0.00052 ohm |

Example 6

Adhesive Strength

The same formulation as was prepared in example 5 was mixed at 20 weight percent with 80 weight percent silver flakes and used as the control composition. Two additional samples were prepared, one containing 19.5 weight percent of the resin formulation, 0.5 weight percent of the salts and 80 weight percent silver flakes, and the second containing 19 weight percent of the resin formulation, 1.0 weight percent of the salts and 80 weight percent silver flakes.

These compositions were tested for adhesive strength using a Dage Die Shear Tester. Each composition was disposed between a 5×5 mm silicon die and a copper coated lead frame with a bond pad of 10.0×10.0×0.12 mm. (Si to Cu bond) or a silver coated lead frame with a bond pad of 10.0× 10.0×0.12 mm. (Si to Ag bond) and cured according to the cure protocols described herein, for which HW is hot/wet, and DSS is die shear strength.

HW-DSS: 30 minutes ramp from 250C to 175° C., hold 15 minutes at 175° C., hold one minute at 240° C. (wire bond simulation), hold four hours at 175° C. (post mold bake simulation), hold 16 hours at 121° C./100%-relative humidity (pressure cooker test environment).

HW-DSS+5-min 270° C.: 30 minutes ramp from 25° C. to 175° C., hold 15 minutes at 175° C., hold one minute at 240° C. (wire bond simulation), hold four hours at 175° C. (post mold bake simulation), hold 16 hours at 121° C./100%-relative humidity (pressure cooker test environment), hold five minutes at 270° C.

Each sample was tested for die shear strength and each test was conducted four times per sample. The results were pooled and averaged and the die shear strength (DSS) reported in Kg force in Table B. The results indicate that the addition of the bisquinolinol improved adhesion.

TABLE B

| DIE SHEAR STRENGTH IN KG FORCE | | |
|---|---|---|
| Metal Salt Si to Metal Lead Frame | HW-DSS | HW-DSS + 5 MIN 270 C. |
| Si to Cu | | |
| Control | 2.20 | 1.31 |
| Al-8-HQ at 0.5 wt % | 3.75 | 2.77 |
| Al-8-HQ at 1.0 wt % | 2.38 | 2.63 |
| Si to Ag | | |
| Control | 2.67 | 1.28 |
| Al-8-HQ at 0.5 wt % | 4.50 | 5.09 |
| Al-8-HQ at 1.0 wt % | 6.55 | 7.08 |

What is claimed is:

1. A curable composition with improved adhesion and conductivity comprising a curable resin, a filler, optionally a curing agent for the resin, and the metal salt of 8-quinolinol or of an 8-quinolinol derivative in which the 8-quinolinol or 8-quinolinol derivative to form the metal salt is selected from the group consisting of

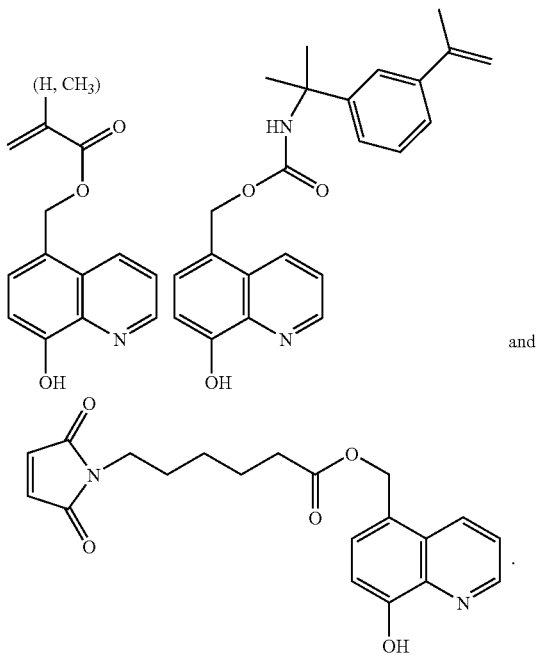

and

2. The curable composition according to claim 1 in which the metal salt of 8-quinolinol or of an 8-quinolinol derivative is formed by coordination with a metal selected from the group consisting of Cu, Be, Mg, Ca, Sr, Ba, Zn, Cd, Al, Ga, In, TI, Yt, La, Pb, Sb, Bi, Cr, Mo, Mn, Fe, Co, Ni, Pd, Ce, and Pr.

3. The curable composition according to claim 2 in which the metal salt of 8-quinolinol or of an 8-quinolinol derivative is formed by coordination with a metal selected from the group consisting of Cu, Zn, and Al.

4. The curable composition according to claim 1, 2, or 3 in which the curable resin is a maleimide resin, an acrylate or methacrylate resin, an epoxy resin, or a cyanate ester resin.

* * * * *